(12) United States Patent
Bina et al.

(10) Patent No.: US 10,153,764 B2
(45) Date of Patent: Dec. 11, 2018

(54) CURRENT MEASUREMENT IN A POWER SEMICONDUCTOR DEVICE

(71) Applicant: Infineon Technologies AG, Neubiberg (DE)

(72) Inventors: Markus Bina, Sauerlach (DE); Jens Barrenscheen, Munich (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/377,750

(22) Filed: Dec. 13, 2016

(65) Prior Publication Data

US 2017/0170823 A1    Jun. 15, 2017

(30) Foreign Application Priority Data

Dec. 14, 2015    (DE) .................. 10 2015 121 722

(51) Int. Cl.
| | |
|---|---|
| *H03K 3/00* | (2006.01) |
| *H03K 17/56* | (2006.01) |
| *G01R 19/00* | (2006.01) |
| *H01L 49/02* | (2006.01) |
| *H01L 29/68* | (2006.01) |

(52) U.S. Cl.
CPC ......... *H03K 17/56* (2013.01); *G01R 19/0092* (2013.01); *H01L 28/60* (2013.01); *H01L 29/68* (2013.01); *H03K 2217/0027* (2013.01)

(58) Field of Classification Search
CPC ...................................................... H03K 17/56
See application file for complete search history.

(56) References Cited

U.S. PATENT DOCUMENTS 6,188,109 B1 *  2/2001  Takahashi ............... H01L 22/34
                                                    257/153
2009/0114986 A1   5/2009  Hirler et al.

FOREIGN PATENT DOCUMENTS

| DE | 19900313 B4 | 9/2005 |
|---|---|---|
| DE | 102009028049 B3 | 2/2011 |

* cited by examiner

*Primary Examiner* — Daniel Puentes
(74) *Attorney, Agent, or Firm* — Murphy, Bilak & Homiller, PLLC

(57) ABSTRACT

A semiconductor device includes a first load terminal, a second load terminal and a semiconductor body coupled to the first load terminal and the second load terminal. The semiconductor body is configured to conduct a load current along a load current path between the first load terminal and the second load terminal. The semiconductor device further includes a control electrode electrically insulated from the semiconductor body and configured to control a part of the load current path, and an electrically floating sensor electrode arranged adjacent to the control electrode. The sensor electrode is electrically insulated from each of the semiconductor body, and the control electrode and is capacitively coupled to the load current path.

16 Claims, 8 Drawing Sheets

CURRENT MEASUREMENT IN A POWER SEMICONDUCTOR DEVICE

TECHNICAL FIELD

This specification refers to embodiments of a semiconductor device, to embodiments of a circuit arrangement and to embodiments of a method of controlling a semiconductor device. In particular, this specification relates to a current measurement in a power semiconductor device, such as a MOS-based power semiconductor device, for example to a capacitive current measurement in a power semiconductor device.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A semiconductor device is usually designed to continuously operate under nominal conditions, according to which, e.g., a load current does normally not exceed a nominal value for more than a predetermined time period.

Occasionally, a semiconductor device may nevertheless become subjected to an overload current that is significantly higher than a nominal load current. For example, the reason for such overload current may be a short circuit in at least one of a component of a power supply and a load.

Even though the semiconductor device may not be designed to continuously operate in the overload state, it may be required that the semiconductor device can withstand the overload current for some period of time without suffering any damages.

However, in order to avoid damage of the semiconductor device due to long-lasting overload situation, it is known to measure the actual load current and to adapt control of the semiconductor device in response to detecting that actual load current exceeds the nominal value.

SUMMARY

According to an embodiment, a semiconductor device comprises a first load terminal, a second load terminal and a semiconductor body coupled to the first load terminal and the second load terminal, wherein the semiconductor body is configured to conduct a load current along a load current path between the first load terminal and the second load terminal. The semiconductor device further comprises a control electrode electrically insulated from the semiconductor body and configured to control a part of the load current path; and an electrically floating sensor electrode arranged adjacent to the control electrode, wherein the sensor electrode is electrically insulated from each of the semiconductor body and the control electrode and is capacitively coupled to the load current path.

According to a further embodiment, a circuit arrangement comprises a semiconductor device, a driver and an evaluation unit. The semiconductor device comprises a first load terminal, a second load terminal and a semiconductor body coupled to the first load terminal and the second load terminal, wherein the semiconductor body is configured to conduct a load current along a load current path between the first load terminal and the second load terminal; a control electrode electrically insulated from the semiconductor body and configured to control the load current path; and an electrically floating sensor electrode, wherein the sensor electrode is electrically insulated from each of the semiconductor body and the control electrode and is capacitively coupled to the load current path. The driver comprises a control signal output electrically coupled to the control electrode. The evaluation unit comprises a sensor signal input electrically coupled to the sensor electrode and configured to receive a sensor signal from the sensor electrode.

According to a yet further embodiment, a method of controlling a semiconductor device is presented. The semiconductor device has a semiconductor body being configured to operate in each of a conducting state, during which a load current is conducted in a load current path between a first load terminal and a second load terminal of the semiconductor device, and in a blocking state, during which a voltage applied between the first load terminal and the second load terminal is blocked and flow of the load current is prevented. The method comprises outputting, by means of control unit, a control signal to a control electrode of the semiconductor device for setting the semiconductor device in one of the conducting state and the blocking state; receiving, from an electrically floating sensor electrode that is electrically insulated from each of the semiconductor body and the control electrode and that is capacitively coupled to the load current path, a sensor signal, the sensor signal being indicative for a magnitude of the load current conducted by the semiconductor body; comparing, by means of an evaluation unit the received sensor signal with a first threshold value range within a first time interval; determining a result signal in dependence of the comparison; and outputting result signal to the control unit. The outputting comprises outputting the result signal such that it is indicative for a first operational state of the semiconductor device if the sensor signal is out of the first threshold value range during the first time interval; and outputting the result signal such that it is indicative for a second operational state of the semiconductor device if the sensor signal is within the first threshold value range.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

Figure 1:
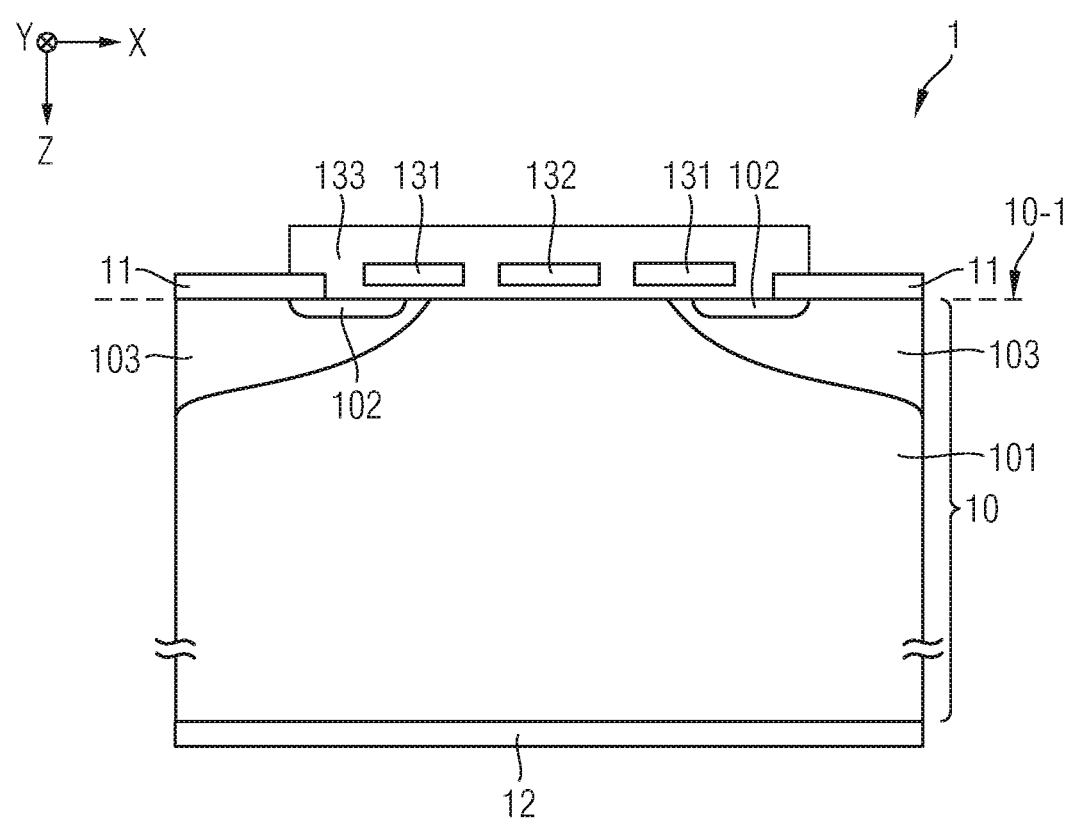
FIG. 1 schematically illustrates a section of a vertical cross-section of a semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom" "below", "front", "behind" "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor body. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer. For example, the extension direction Z mentioned below may be a vertical direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone, such as a semiconductor region within a trench. Thus, e.g., a statement saying that a specific semiconductor region exhibits a certain dopant concentration that is higher or lower as compared to a dopant concentration of another semiconductor region may indicate that the respective mean dopant concentrations of the semiconductor regions differ from each other.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, such as a power semiconductor transistor, that may be used within a power converter or a power supply. Thus, in an embodiment, the semiconductor device is configured for carrying a load current that is to be fed to a load and/or, respectively, that is provided by a power source. For example, the semiconductor device may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above.

Figure 9:
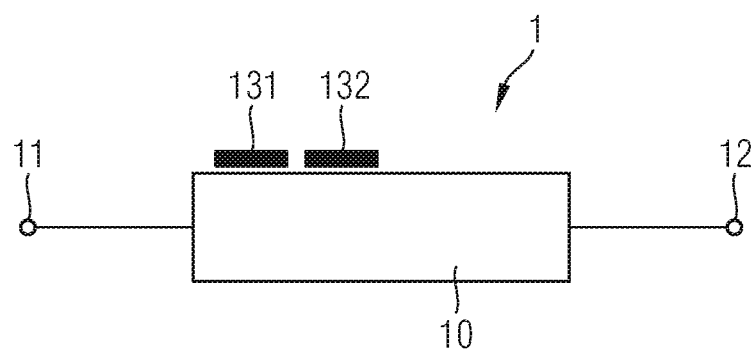
FIG. 9 schematically illustrates an exemplary representation of a semiconductor device in accordance with one or more embodiments.

FIG. 9 schematically illustrates an exemplary representation of a semiconductor device 1 in accordance with one or more embodiments. On the basis of FIG. 9, some exemplary components and functions of the semiconductor device 1 shall be explained.

The semiconductor device 1 comprises a first load terminal 11 and a second load terminal 12. Coupled to each of the first load terminal 11 and the second load terminal 12 is a semiconductor body 10, wherein the semiconductor body 10 is configured to conduct a load current along a load current path between the first load terminal 11 and the second load terminal 12. For example, the load current is fed into the semiconductor body 10 by means of the second load terminal 12 and output out of the semiconductor body 10 by means of the first load terminal 11 or, respectively, vice versa. Further, in an embodiment, the semiconductor device 1 may be configured to conduct the load current bi-directionally. In an embodiment, the load current may be greater than 5 A, greater than 50 A, greater than 100 A or even greater than 1 kA.

The semiconductor device 1 may further comprise a control electrode 131 that is electrically insulated from the semiconductor body 10 and configured to control at least a part of the load current path. For example, the semiconductor device 1 comprises an insulation (not shown in FIG. 9) that is configured to establish said electrical insulation between the control electrode 131 and the semiconductor body 10. Further, the control electrode 131 may also be electrically insulated from the second load terminal 12 and the first load terminal 11, wherein the latter insulation may also be established by means of the insulation, in accordance with an embodiment.

For example, the control electrode 131 may be configured to prevent a load current path from coming into being or, respectively, to cut off a present load current path for setting the semiconductor device 1 into one of a conducting state and a blocking state or, respectively, for maintaining the blocking state of the semiconductor device 1.

In accordance with an embodiment, the semiconductor device 1 further comprises an electrical floating sensor electrode 132 that may be arranged adjacent to the control electrode 131. The sensor electrode 132 may be electrically insulated from each of the semiconductor body 10 and the control electrode 131. For example, the sensor electrode 132 is capacitively coupled to the load current path.

For example, a distance between the control electrode 131 and the sensor electrode 132 amounts to less than 3 µm. Said distance may be even smaller, e.g., smaller than 2 µm, smaller than 1 µm, or even smaller than 500 nm.

In an embodiment, the sensor electrode 132 may be configured to provide a sensor signal. For example, the sensor signal is indicative for a magnitude of the load current conducted by the semiconductor body 10 via the load current path. Further, the sensor signal may be generated by at least an amount of electric charge present within the sensor electrode 132. In accordance with an embodiment, the sensor signal itself does not contribute to the load current conducted by the semiconductor body 10.

For example, the sensor electrode 132 may form a capacitor with at least a section of the semiconductor body 10 that is traversed by the load current path. Thus, an amount of electric charge being present within the sensor electrode 132 may be responsive to charge carrier density of the load current path. For example, an increase of the charge carrier density of the load current path may lead to an increase of the amount of electric charge in the sensor electrode 132. Thus, in an embodiment, due to the capacitive coupling between the sensor electrode 132 and the semiconductor body 10, the magnitude of the load current actually conducted by the semiconductor body 10 via the load current path may influence the amount of charge being present in the sensor electrode 132. Summarizing, in an embodiment, the sensor electrode 132 is arranged such that the current density of the load current path induces an amount of electric charge within the sensor electrode 132 due to the capacitive coupling between the load current path and the sensor electrode 132, wherein such induced amount of charge may form the sensor signal provided by the sensor electrode 132.

In an embodiment, the capacitive coupling between the sensor electrode 132 and the section of the semiconductor body 10 that is traversed by load current path is established by means of only said insulation (not illustrated in FIG. 9). In other words, the sensor electrode 132 may be capacitively coupled to the load current path established within the semiconductor body 10 by means of, e.g., only the insulation, which may, as has been explained above, simultaneously provide for the electrical insulation between the semiconductor body 10 including said section being traversed by the load current path and the sensor electrode 132.

For example, a transition from the section of the semiconductor body 10 that is configured to form a part of the load current path to the sensor electrode 132 only comprises a section of the insulation. In an embodiment, the distance of said transition between the load current path and the sensor electrode 132 is less than 3 µm. The distance of said transition may be even smaller, e.g., smaller than 2 µm, smaller than 1 µm, or even smaller than 500 nm. Thus, in an embodiment, a voltage between the sensor electrode 132 on the one side and the section of the semiconductor body 10 that is traversed by the load current path on the other side drops only along the insulation.

Each of FIGS. 1 to 4 schematically illustrates an exemplary embodiment that may realize one or more of the components and/or functions of the semiconductor device 1 exemplarily described with respect to FIG. 9.

FIG. 1 schematically illustrates a section of a vertical cross-section of a semiconductor device 1 in accordance with one or more embodiments. In this example, the vertical cross-section is in parallel to a plane defined by the vertical direction Z and the first lateral direction X. Each of the components of the semiconductor device 1 illustrated in FIG. 1 may extend along the second lateral direction Y.

The semiconductor device 1 comprises a first load terminal 11 and a second load terminal 12. For example, the first load terminal 11 may comprise a first metallization, e.g., a frontside metallization, and the second load terminal 12 may comprise a second metallization, e.g., a backside metallization. Coupled to each of the first load terminal 11 and the second load terminal 12 is a semiconductor body 10, wherein the semiconductor body 10 is configured to conduct a load current along a load current path between the first load terminal 11 and the second load terminal 12. For example, the load current is fed into the semiconductor body 10 by means of the second load terminal 12 and output out of the semiconductor body 10 by means of the first load terminal 11 or, respectively, vice versa. Further, in an embodiment, the semiconductor device 1 may be configured to conduct the load current bi-directionally, e.g., in each of a direction in parallel to the vertical direction Z and in a direction opposite to the vertical direction Z.

The semiconductor body 10 may comprise a semiconductor drift region 101 that has dopants of a first conductivity type and that is configured to form at least a part of the load current path. In an embodiment, the semiconductor drift region 101 is an n⁻-doped region, e.g., a region having a comparatively low dopant concentration of donors.

The semiconductor body 10 may further comprise one or more semiconductor body regions 103 that have dopants of a second conductivity type complementary to the first conductivity type. For example, the semiconductor body regions 103 are p-doped, wherein a dopant concentration of a respective semiconductor body region 103 may vary. For example, the semiconductor body regions 103 are each connected to the first load terminal 11, wherein a dopant concentration of the semiconductor body regions in proximity to the first load terminal 11 optionally may be higher as compared to, e.g., sections of the semiconductor body regions 103 arranged deeper along the vertical direction Z.

The semiconductor device 1 may further comprise one or more source regions 102 that are electrically connected to the first load terminal 11. For example, the source regions 102 are semiconductor source regions 102 that comprise dopants of the first conductivity type, e.g., at a comparatively high dopant concentration. In an embodiment, the semiconductor source regions 102 are $n^+$-doped regions. In another embodiment, the source regions 102 are metal source regions 102. For example, each of the source regions 102 is isolated from the semiconductor drift region 101 by means of a respective semiconductor body region 103, as schematically illustrated in FIG. 1. Further, in a section below a respective source region 102, the semiconductor body region 103 may exhibit a comparatively high dopant concentration, e.g., a $p^+$-section. For example, this may allow for reducing the risk of latching. In proximity to a respective transition between the source region 102 and the semiconductor body region 103, the dopant concentration of the respective section of the semiconductor body region 103 may be comparatively low.

The semiconductor device 1 may further comprise one or more control electrodes 131 that are electrically insulated from the semiconductor body 10 and configured to control a part of the load current path. For example, the semiconductor device 1 comprises an insulation structure 133 that is configured to establish said electrical insulation between the one or more control electrodes 131 and the semiconductor body 10. Further, the one or more control electrodes 131 may also be electrically insulated from the second load terminal 12 and the first load terminal 11, wherein the latter insulation may also be established by means of the insulation structure 133, in accordance with an embodiment.

In an embodiment, each of the one or more control electrodes 131 is arranged in proximity to at least one of the source regions 102 and at least one of the semiconductor body regions 103 and is configured to induce, upon receiving a control signal from external of semiconductor body 10, an inversion channel within the semiconductor body region 103 for forming said load current path. Thus, in an embodiment, the one or more inversion channels induced within the one or more semiconductor body regions 103 by means of the one or more control electrodes 131 may each form at least a part of the load current path mentioned above. Further, the one or more control electrodes 131 may be configured to prevent a load current path from coming into being or, respectively, to cut off a present load current path for setting the semiconductor device 1 into a blocking state or, respectively, for maintaining the blocking state of the semiconductor device 1.

The components of the semiconductor device 1 mentioned above, namely the semiconductor body 10 that may include the one or more semiconductor body regions 103 and the one or more source regions 102, the insulation structure 133 and the one or more control electrodes 131 may form a MOS-control head of the semiconductor device 1, in accordance with one or more embodiments.

In accordance with the embodiment schematically illustrated in FIG. 1, the one or more control electrodes 131 may be arranged above a surface 10-1 of the semiconductor body 10, thereby yielding, e.g., a planar gate structure. In accordance with one or more other embodiments, e.g., as they will be explained with respect to FIGS. 2 to 4, the one or more control electrodes 131 may also each be included in a respective trench of the semiconductor device 1, thereby yielding, e.g., a trench gate structure of the semiconductor device 1.

The exemplary structure of the semiconductor device 1 illustrated in each of FIGS. 1 to 4 may be employed, e.g., for forming a power semiconductor device, such as an IGBT, an RC-IGBT, a MOSFET, a MGD and/or derivatives thereof. To this end, it shall be understood that the embodiments of the semiconductor device 1 as schematically and exemplary illustrated in FIGS. 1 to 4 may comprise additional semiconductor regions, e.g., a field stop layer (also referred to as buffer layer) in proximity to the second load terminal 12, e.g., a comparatively highly doped $n^+$-layer, and/or an emitter layer in proximity to the second load terminal 12, such as a $p^+$-emitter layer, one or more n-shorts and so forth. Further, in an embodiment, the first load terminal 11 may form a source (S) electrode, the second load terminal 12 may form a drain (D) electrode and the one or more control electrodes 131 may form gate (G) electrodes.

In accordance with an embodiment, the semiconductor device 1 further comprises an electrical floating sensor electrode 132 that may be arranged adjacent to the control electrode 131. The sensor electrode 132 may be electrically insulated from each of the semiconductor body 10 and the control electrode 131. For example, the sensor electrode 132 is capacitively coupled to the load current path.

In accordance with the embodiments schematically illustrated in FIG. 1, said insulation structure 133 may be configured to provide for the electrical insulation between the sensor electrode 132 on the one side and each of the one or more control electrodes 131 and the semiconductor body 10 on the other side. Further in accordance with the exemplary embodiment schematically illustrated in FIG. 1, also the sensor electrode 132 may exhibit a planar structure and may be arranged above the surface 10-1 of the semiconductor body 10.

For example, a distance along the first lateral direction X between at least one of the control electrodes 131 and the sensor electrode 132 amounts to less than 3 μm. Said distance may be even smaller, e.g., smaller than 2 μm, smaller than 1 μm, or even smaller than 500 nm. Thus, it shall be understood that in accordance with one or more embodiments, that the sensor electrode 132 and an active region of the semiconductor body 10 may exhibit a common lateral extension range in at least one of the first lateral direction X and the second lateral direction Y. Within the present specification, the active region of the semiconductor body 10 is that region that actually conducts the load current, and not, e.g., a measurement current or the like. For example, the active region may be surrounded by an edge region (not illustrated; also referred to as "junction termination region" or "non-active region"). The active region of the semiconductor device 1 may be formed by one or more active cells, e.g. a stripe cell or a needle cell, wherein each active cell may comprise a MOS-control head as exemplarily illustrated in FIG. 1 and explained above. For example, the sensor electrode 132 may be a part of such an active cell.

By contrast, the sensor electrode 132 is, e.g., not part of a cell that is used only for measurement purposes, and not for conducting the load current.

In an embodiment, the sensor electrode 132 may be configured to provide a sensor signal, e.g., to external of the semiconductor body 10. For example, the sensor signal is indicative for a magnitude of the load current conducted by the semiconductor body 10 via the load current path. Further, the sensor signal may be generated by at least an amount of electric charge present within the sensor electrode 132. In accordance with an embodiment, the sensor signal itself does not contribute to the load current conducted by the semiconductor body 10.

For example, the sensor electrode 132 may form a capacitor with at least a section of the semiconductor body 10 that is traversed by the load current path, e.g., with at least one of the semiconductor drift region 101 and the semiconductor body region 103. Thus, an amount of electric charge being present within the sensor electrode 132 may be responsive to charge carrier density of the load current path that may be formed partially, as has been explained above, by means of an inversion channel at least in the semiconductor body regions 103 and/or at a surface of the semiconductor drift region 101. For example, an increase of the charge carrier density of the load current path may lead to an increase of the amount of electric charge in the sensor electrode 132. Thus, in an embodiment, due to the capacitive coupling between the sensor electrode 132 and the semiconductor body 10, the magnitude of the load current actually conducted by the semiconductor body 10 via the load current path may influence the amount of charge being present in the sensor electrode 132. The sensor electrode 132 may be arranged such that the current density of the load current path induces an amount of electric charge within the sensor electrode 132 due to the capacitive coupling between the load current path and the sensor electrode 132, wherein such induced amount of charge may form the sensor signal provided by the sensor electrode 132.

In an embodiment, a capacitive coupling between the sensor electrode 132 and the section of the semiconductor body 10 that is traversed by load current path is established by means of only said insulation structure 133. In other words, the sensor electrode 132 may be capacitively coupled to the load current path established within the semiconductor body 10 by means of, e.g., only the insulation structure 133, which may, as has been explained above, simultaneously provide for the electrical insulation between the semiconductor body 10 including said section being traversed by the load current path and the sensor electrode 132.

For example, a transition from the section of the semiconductor body 10 that is configured to form a part of the load current path to the sensor electrode 132 only comprises a section of the insulation structure 133. In an embodiment, the distance of said transition between the load current path and the sensor electrode 132 is less than 3 µm. The distance of said transition may be even smaller, e.g., smaller than 2 µm, smaller than 1 µm, or even smaller than 500 nm. Thus, in an embodiment, a voltage between the sensor electrode 132 on the one side and the section of the semiconductor body 10 that is traversed by the load current path on the other side drops only along the insulation structure 133. Thus, a voltage drop between the sensor electrode 132 and said section of the semiconductor body 10 does not include a significant further voltage drop across the semiconductor drift region 101 or any other regions of the semiconductor body, in accordance with one or more embodiments. For example, said further voltage drop is lower than 1 V, lower than 0.5 V or even lower than 0.2 V. In an embodiment, said further voltage drop may even amount to zero.

Figure 2:
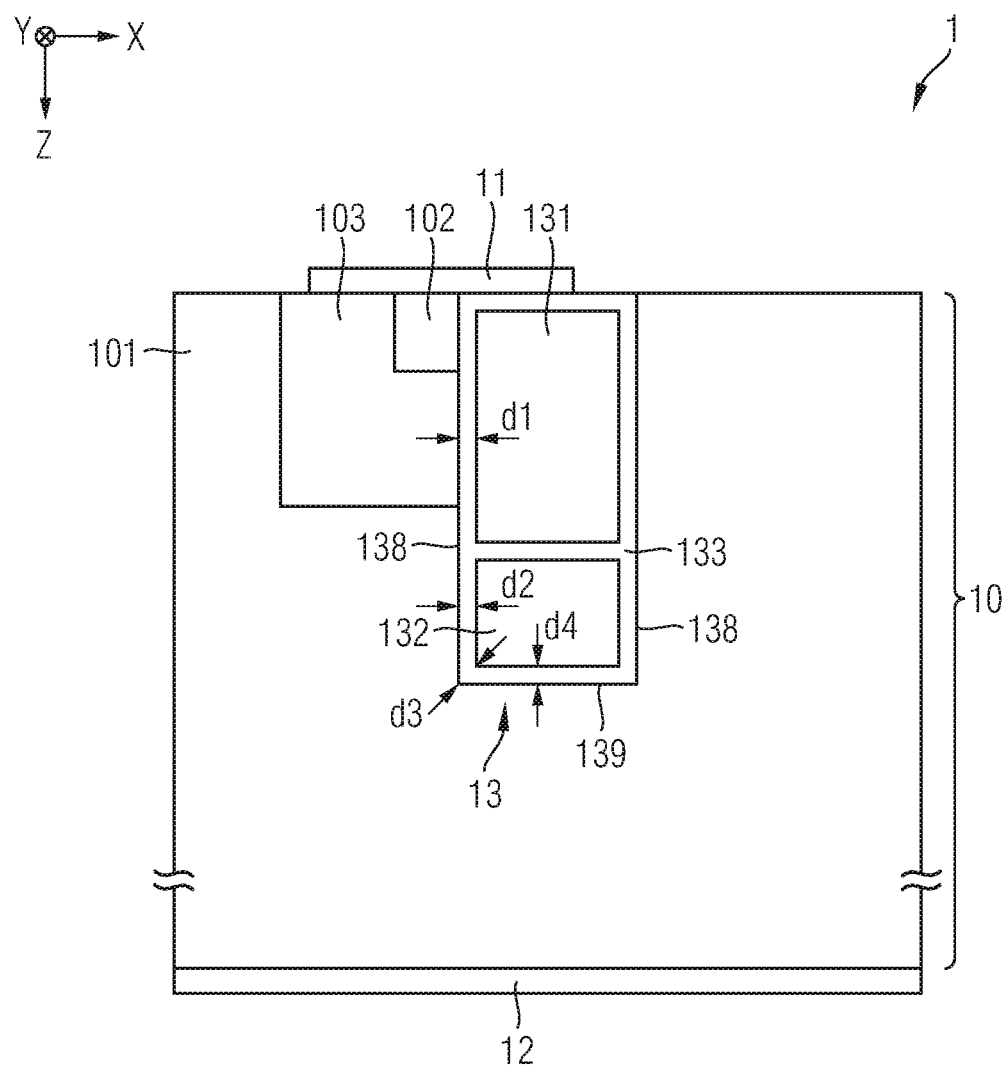
FIG. 2 schematically illustrates a section of a vertical cross-section of a semiconductor device in accordance with one or more embodiments.

In accordance with the embodiment schematically illustrated in FIG. 2, each of the control electrode 131 and the sensor electrode 132 are included in a trench 13 of the semiconductor device 1. The trench 13 extends into the semiconductor body 10, e.g., into the semiconductor drift region 101 along the vertical direction Z and may be arranged in contact with a section of the semiconductor body region 103. The trench 13 may further be arranged in contact with a section of the source region 102.

Figure 3:
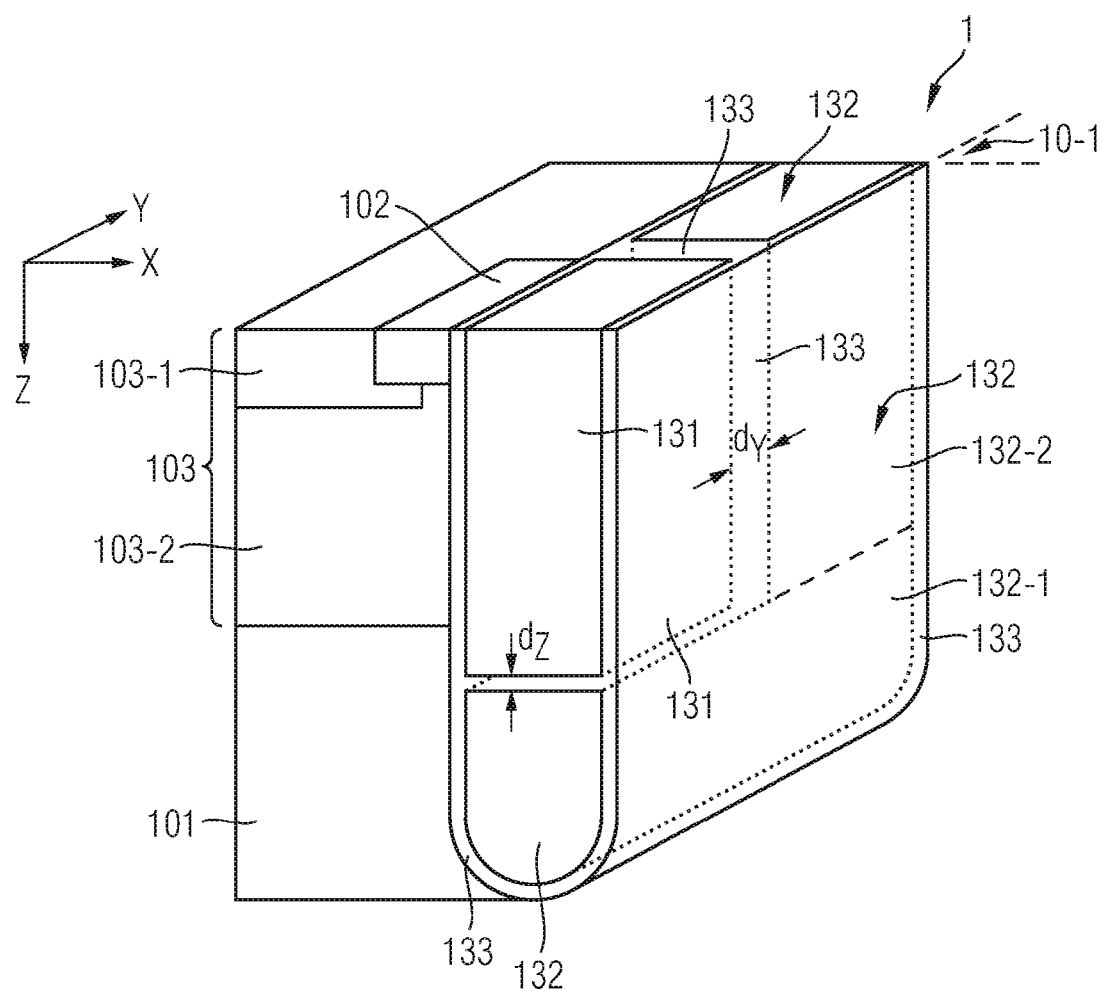
FIG. 3 schematically illustrates a section of a perspective view on a semiconductor device in accordance with one or more embodiments.
Figure 4:
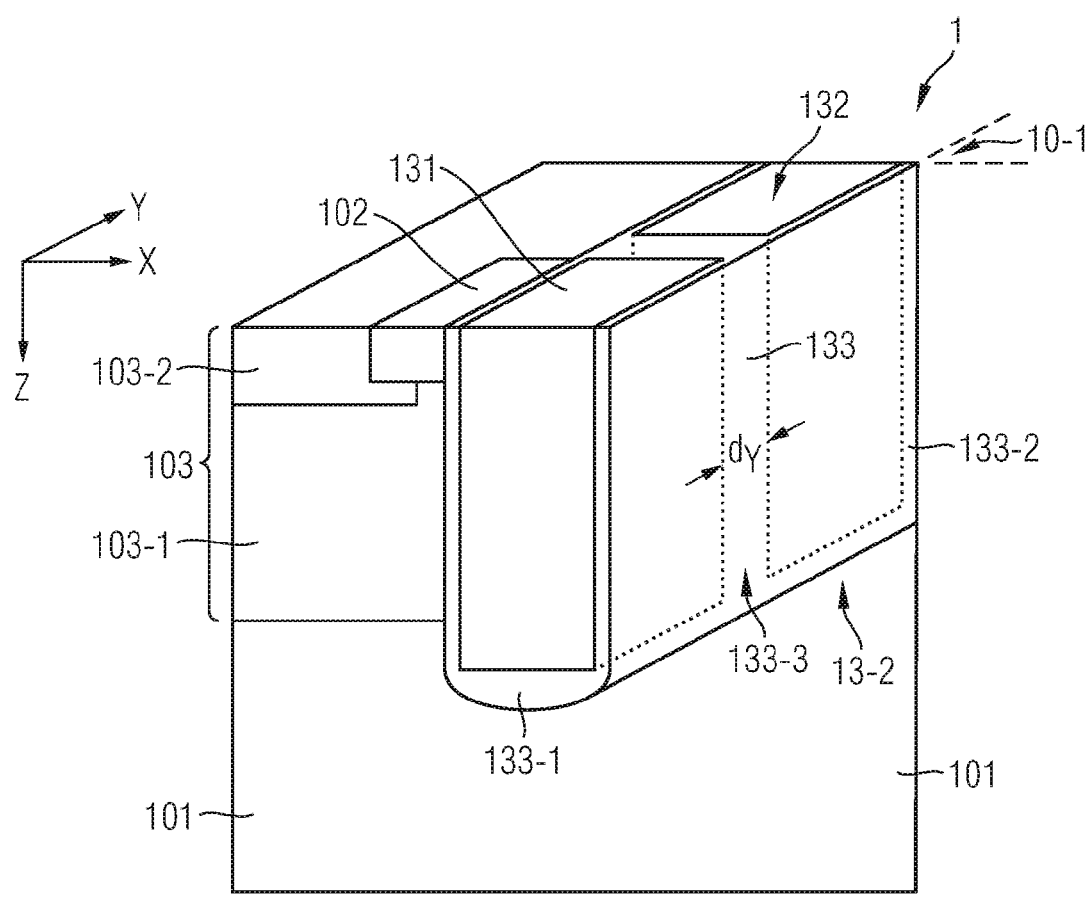
FIG. 4 schematically illustrates a section of a perspective view on a semiconductor device in accordance with one or more embodiments.

It shall be understood that what has been stated above regarding the control electrode 131, the sensor electrode 132, the insulation structure 133, the semiconductor body region 103, the source region 102, the semiconductor drift region 101, the semiconductor body 10, the first load terminal 11 and the second load terminal 12 of the semiconductor device 1 schematically illustrated in FIG. 1 may equally apply to the embodiments schematically illustrated in each of FIG. 2 to FIG. 4, if not stated otherwise.

In accordance with the embodiment schematically illustrated in FIG. 2, said trench 13 also comprises the insulation structure 133 that electrically insulates each of the control electrode 131 and the sensor electrode 132 from the semiconductor body 10 and that electrically insulates the control electrode 131 from the sensor electrode 132.

In an embodiment, the control electrode 131 extends at least as far along the vertical direction Z as the section of the semiconductor body region 103 that may be in contact with the trench 13. As has been explained above, the control electrode 131 may be configured to induce an inversion channel within the semiconductor body region 103 so as to form said load current path between the first load terminal 11 and the second load terminal 12. If the semiconductor device exhibits a vertical set-up, as schematically illustrated in FIG. 2, the load current path may be formed along the vertical extension of the trench 13 and, thereby, be located in proximity to the sensor electrode 132. As has further been explained above, a charge carrier density being present within the formed load current path may influence the amount of electric charge being present within the sensor electrode 132 due to the capacitive coupling between the section of the semiconductor body 10 that is traversed by the load current path on the one side and the sensor electrode 132 on the other side. As has further been explained above, said capacitive coupling may be established by means of the insulation structure 133, in accordance with one or more embodiments.

In accordance with the embodiment schematically illustrated in FIG. 2, the sensor electrode 132 may be arranged within the same trench 13 as the control electrode 131. For example, the sensor electrode 132 extends at least as far along the vertical direction Z as the control electrode 131. In the embodiment schematically illustrated in FIG. 2, at least a section of the sensor electrode 132 is arranged below the control electrode 131. Further, the insulation structure 133 that is at least partially included in the trench 13 may form sidewalls 138 and a bottom 139 of the trench 13, as illustrated in FIG. 2.

In accordance with an embodiment, the thickness of the insulation structure may vary along the vertical direction Z. For example, the trench sidewalls 138 comprise an upper part and a lower part, and wherein the thickness d2 of the insulation structure 133 at the lower part is equal to or smaller than the thickness d1 of the insulation structure 133 at the upper part. The control electrode 131 may be arranged at a level of the upper part and the sensor electrode 132 may be arranged at a level of the lower part, as indicated in FIG. 2. Thus, the section of the insulation structure 133 that insulates the control electrode 131 from the semiconductor body 10 along the first lateral direction X may be thicker than the section of the insulation structure 133 that insulates the sensor electrode 132 from the semiconductor body 10 along the first lateral direction X.

Further, the thickness of the insulation structure 133 at the trench bottom 139, e.g., distance d3 and/or distance d4 indicated in FIG. 2, may be equal to or smaller than the thickness of the insulation structure 133 at the trench side walls 138, e.g. distance d1 and/or distance d2 indicated in FIG. 2. For example, the thickness of the insulation structure 133 that effectively insulates the sensor electrode 132 from the semiconductor body 10, e.g., one or each of distances d3 and d4 indicated in FIG. 2, is equal to or smaller as compared to the thickness of the insulation structure 133 that effectively insulates the control electrode 131 from the semiconductor body 10, e.g. distance d1 indicated in FIG. 2. In an example, the thickness of the insulation structure 133 along a vertical path in the vertical direction Z from the sensor electrode 132 to the semiconductor body 10, e.g., distance d4, is smaller than the thickness of the insulation structure 133 along a path in the first lateral direction X from the control electrode 131 to the semiconductor body 10, e.g., distance d1. For example, said thickness along the vertical direction Z, e.g., distance d4, amounts to less than 90% of said thickness along the first lateral direction X, e.g., distance d1, between the control electrode 131 and the semiconductor body 10. The same may apply to the thickness of the insulation structure 133 at the trench corner of the trench 13, e.g., distance d3. Thus, in an embodiment, the insulation structure 133 and the trench 13 are designed such at least one of the following equations (i) and (ii) apply:

$$d3 \leq 0.9 \cdot d1 \quad \text{(i)}$$

$$d4 \leq 0.9 \cdot d1 \quad \text{(ii)}$$

Further, the thickness of the insulation structure 133 along a path in the first lateral direction X from the sensor electrode 132 to the semiconductor body 10, e.g., distance d2, may also be smaller than said thickness along the lateral direction X present between the control electrode 131 and the semiconductor body 10, e.g., distance d1 wherein said thickness along the first lateral direction X between the sensor electrode 132 and the semiconductor body 10, e.g., distance d2, may also be substantially equal to the thickness along the first lateral direction X between the control electrode 131 and the semiconductor body 10, e.g., distance d1.

Further, it shall be understood that the trench 13 may exhibit a substantially symmetric set-up along the first lateral direction X, i.e., the trench 13 may be mirror symmetric to an axis in parallel to the vertical direction. Thus, distances d1, d2 and d3 may equally be present at the each one of the two trench sidewalls 138.

Also in accordance with the embodiment schematically illustrated in FIG. 2, the distance between the sensor electrode 132 and the control electrode 131 in the vertical direction Z may amount to less than 3 µm. Said distance may be even smaller, e.g., smaller than 2 µm, smaller than 1 µm, or even smaller than 500 nm. Thus, the sensor electrode 132 may be arranged in proximity to the control electrode 131.

FIG. 3 schematically illustrates a section of a perspective view on a semiconductor device 1 in accordance with one or more embodiments. The principle set-up of the embodiment schematically illustrated in FIG. 3 corresponds to the set-up of the embodiment schematically illustrated in FIG. 2. Thus, what has been stated above regarding embodiment of FIG. 2 may equally apply to the embodiment of FIG. 3, if not stated otherwise. As introductorily mentioned, the semiconductor body region 103 may exhibit an inhomogeneous dopant concentration. For example, a contact section 103-1 of the semiconductor body region 103 that is in contact with the first load terminal 11 (not illustrated in FIG. 3) is comparatively highly doped, whereas the remaining section 103-2 of the semiconductor body region 103 may exhibit a medium dopant concentration. For example, said contact section 103-1 is a $p^+$-doped region, whereas the remaining section 103-2 is a p-doped region.

Further, as illustrated in FIG. 3, the sensor electrode 132 may be configured to provide the sensor signal to external of the semiconductor body 10. In accordance with the exemplary embodiment schematically illustrated in FIG. 3, this may be achieved by certain spatial dimensions of the sensor electrode 132. For example, the sensor electrode 132 may comprise a lateral section 132-1 that is arranged entirely below the control electrode 131 and that may have a lateral extension range along each of the first lateral direction X and the second lateral direction Y in common with the control electrode 131. Further, the sensor electrode 132 may comprise a vertical section 132-2 in contact with the lateral section 132-1 that extends from the lateral section 132-1 in parallel to the vertical direction Z up to the surface 10-1 of the semiconductor body 10. At this point, the sensor electrode 132 may be contacted by sensor electrode contacting means, e.g., a surface metallization (not illustrated), for example a contact runner and/or a contact pad or the like. Said sensor electrode contacting means may be employed, e.g., for forwarding the sensor signal to an evaluation unit that is, e.g., configured to evaluate the provided sensor signal, e.g., in terms of value. This optional aspect will be elucidated in more detail further below.

Further, a distance $d_Y$ along the second lateral direction Y between the control electrode 131 and the vertical section 132-2 of the sensor electrode 132 may amount to less than 3 µm, and a distance $d_Z$ along the vertical direction between the control electrode 131 and the lateral section 132-1 of the sensor electrode 132 may also amount to less than 3 µm. One or both of said distances $d_Y$ and $d_Z$ may be even smaller, e.g., smaller than 2 µm, smaller than 1 µm, or even smaller than 500 nm.

In accordance with yet a further embodiment that is schematically illustrated in FIG. 4, the sensor electrode 132 may be arranged in a separate trench 13-2 and may exhibit, e.g., the same spatial dimensions as compared to the control electrode 131 that may be arranged in another separate trench 13-1. As also illustrated in FIG. 4, the sensor electrode 132 must not necessarily extend deeper along the vertical direction Z as compared to the control electrode 131. The distance $d_Y$ between the control electrode 131 and the sensor electrode 132 along the second lateral direction Y may amount to less than 3 µm. Said distance may be even smaller, e.g., smaller than 2 µm, smaller than 1 µm, or even smaller than 500 nm. Further, the control electrode 131 may be insulated from the semiconductor body by means of a first insulation structure 133-1 and the sensor electrode 132 may be electrically insulated from the semiconductor body 10 by means of a second insulation structure 133-2. The space in between the control electrode 131 and the sensor electrode 132 may be substantially filled with a further insulation structure 133-3, as schematically illustrated in FIG. 4, or, alternatively, with a semiconductor region, such as an n-region and/or a p-region. For example the structure as schematically illustrated in FIG. 4 may be employed for establishing a so called micro-pattern-trench structure within the semiconductor device 1.

Figure 5:
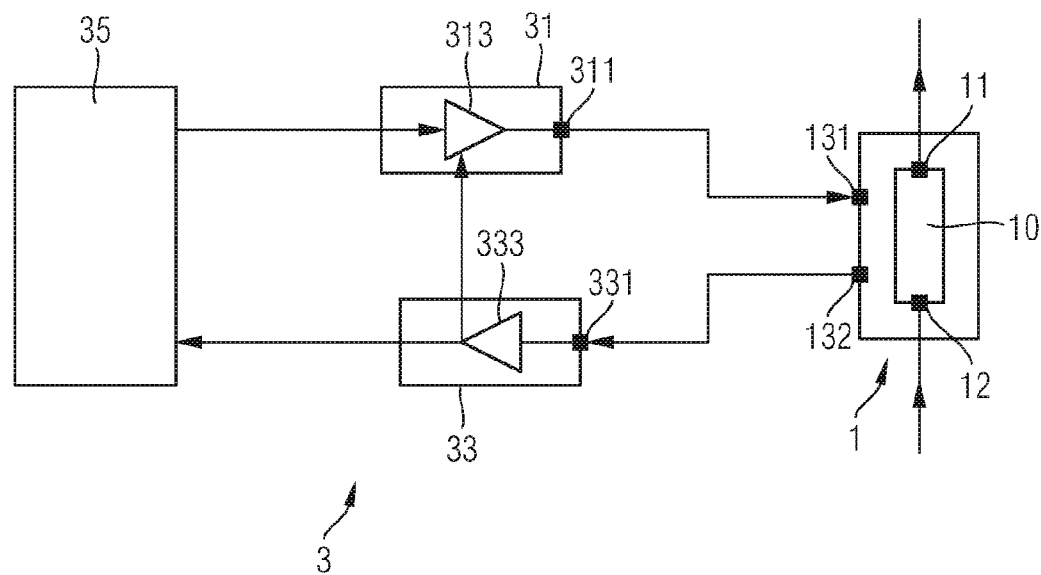
FIG. 5 schematically illustrates a section of a block diagram of a circuit arrangement in accordance with one or more embodiments.

FIG. 5 schematically illustrates a section of a block diagram of a circuit arrangement 3 in accordance with one or more embodiments. The circuit arrangement 3 comprises a semiconductor device 1, a driver 31 for operating the semiconductor device 1 and an evaluation unit 33 for receiving a sensor signal from the semiconductor device 1.

The semiconductor device 1 of the circuit arrangement 3 may exhibit a similar or an identical set-up as exemplarily and schematically illustrated in FIG. 9 or in one of FIG. 1 to FIG. 4. Accordingly, the semiconductor device 1 of the circuit arrangement 3 may comprise a first load terminal 11, a second load terminal 12 and a semiconductor body 10 coupled to said load terminals 11, 12, when the semiconductor body 10 may be configured to conduct a load current along a load current path between said terminals 11, 12. The semiconductor device 1 of the circuit arrangement 3 may further comprise a control electrode 131 electrically insulated from the semiconductor body 10 and configured to control the load current path, e.g., in a manner as explained above with respect to FIGS. 1 to 4 and 9. Further, the semiconductor device 1 of the circuit arrangement 3 may comprise an electrically floating sensor electrode 132, wherein said sensor electrode 132 may be electrically insulated from each of the semiconductor body 10 and the control electrode 131 and may be capacitively coupled to the load current path that can be formed within the semiconductor body 10.

It shall be understood that the semiconductor device 1 of the semiconductor device 1 of the circuit arrangement 3 may be identical to one of the embodiments described above with respect to FIGS. 1 to 4 and 9. Thus, what has been stated above may equally apply to the semiconductor device 1 of the circuit arrangement 3. Further, what is stated below about optional aspects of the semiconductor device 1 of the circuit arrangement 3 may equally apply to the embodiments of the semiconductor device described above with respect to FIGS. 1 to 4 and 9.

The driver 31 of the circuit arrangement 3 may comprise a control signal output 311 that is electrically coupled, e.g., electrically connected, to the control electrode 131 of the semiconductor device 1. For example, the driver is configured to provide a control signal to the control electrode 131 such that the control electrode 131 may set the semiconductor body 10 in one of a conducting state and a blocking state. To this end, the driver 31 may comprise a control signal generator 313 that can be configured generate said control signal, e.g., by applying a voltage between one of the load terminals 11, 12 and the control electrode 131. Upon receiving the control signal, the control electrode 131 may control the load current path within the semiconductor body 10, e.g., by inducing an inversion channel within a semiconductor body region (not illustrated) of the semiconductor body 10 so as to form said load current path. Thereby, the semiconductor device 1 may be set into a conducting state. Further, upon receiving the control signal, the control electrode 131 may cut off the load current path. Thereby, the semiconductor device 1 may be set into a blocking state.

The evaluation unit 33 may comprise a sensor signal input 331 that is electrically coupled, e.g., electrically connected, to the sensor electrode 132 and that is configured to receive a sensor signal from the sensor electrode 132. As has been explained above, the sensor signal may be indicative for a magnitude of the load current conducted by the semiconductor device via the load current path. For example, the evaluation unit 33 is configured to derive a result signal from the received sensor signal, the result signal being indicative for an operational state of the semiconductor body 10. Examples of such operational states will be presented below. To this end, the evaluation unit 33 may comprise processing means 333 configured to process the received sensor signal and to output the result signal. It shall be understood that, in an embodiment, the processing means 333 may be set up by entirely passive components such as a capacitor and/or a resistor, but may also comprise analog and/or digital signal processing units in other embodiments. Thus, the result signal may either be an analog result signal or a digital result signal.

Further, in an embodiment, the evaluation unit 33 may be coupled to the driver 31 and may be configured to provide the result signal to the driver 31. For example, the result signal provided to the driver 31 may cause the control signal generator 313 to provide the control signal to the control electrode 131 such that the load current path is cut off, e.g., such that the semiconductor device 1 is set into a blocking state. This can, for instance, apply, if the result signal is indicative of an overload state of the semiconductor device 1, i.e., in case the actually conducted load current is significantly greater than a nominal load current for which the semiconductor device 1 is designed.

In an embodiment, the control signal generator 313 is configured to set the semiconductor device 1 into a blocking state by providing the control signal with a first signal course, e.g., during nominal operation, e.g., in response to receiving an instruction from the system controller 35 (explained in more detail below), and to set the semiconductor device 1 into a blocking state by providing the control signal with a second signal course different from the first signal course, e.g., during an overload state, e.g., in response to receiving the result signal from the evaluation unit 33. For example, the second signal course of the control signal may cause a slower or, respectively, softer turn-off process (blocking state) of the semiconductor device 1 as compared to the first signal course. For example, this may be achieved by discharging the control electrode 131 with a lower current as compared to the turn-off during nominal operating conditions, e.g., during a regular turn-off instructed by the system controller 35.

The circuit arrangement 3 may further comprise said system controller 35 that may be coupled to each of the driver 31 and the evaluation unit 33. The evaluation unit 33 may be configured to provide the result signal to the system controller 35, e.g., alternatively to providing the result signal to the driver 31 or additionally to providing the result signal to the driver 31.

The system controller 35 may be configured to control the driver 31, e.g., by instructing the driver 31 to set the semiconductor device 1 in one of the conducting state and the blocking state. Further, the system controller 35 may comprise additional evaluation means (not illustrated) for evaluating the result signal provided by the evaluation unit 33, e.g., by monitoring the provided result signal. Further, the system controller 35 may be configured to instruct the driver 31 in dependence of the evaluated result signal. For example, the system controller 35 may be configured to control more than one semiconductor device 1, for example an entire power converter comprising a plurality of semiconductor devices 1. To this end, the system controller 35 may comprise digital signal processing means, a memory for storing code that comprises an instruction set indicative for at least one control algorithm, for example a pulse width modulation control algorithm or another intelligent driving concept for controlling one or more semiconductor devices 1.

Thus, in an embodiment, the evaluation unit 33 may be configured to provide the result signal to the driver 31, wherein the driver 31 may be configured, in response to receiving the result signal, to set the semiconductor device into a blocking state, e.g., by providing the control signal with the second signal course which may lead to, as has been explained above, to a slower or, respectively, softer turn-off process as compared to the nominal operation. Further, upon receiving the result signal from the evaluation unit 33, the driver 31 may be configured to disregard an eventual contrary instruction received from the system controller 35. Thereby, an immediate turn-off process (blocking state) of the semiconductor device 1 can be initiated, since the result signal is, in this embodiment, not subjected to further evaluation steps by means of the system controller 35 before being provided to the driver 31, but is rather directly provided to the driver 31 by the evaluation unit 33.

In accordance with an embodiment, the evaluation unit 33 may be configured to set the sensor signal input 331 in a high impedance state. Thereby, the sensor electrode 132 may remain electrically floating. However, it shall be understood that, in one or more embodiments, the sensor electrode 132 may receive a carrier signal, e.g., a carrier signal exhibiting the course of a sign wave, or may otherwise be biased, for example to allow for a differential detection of sensor signal, e.g., a differential detection of the amount of charge that may be induced in the sensor electrode 132 due to a certain charge carrier density of the load current path.

Figure 6:
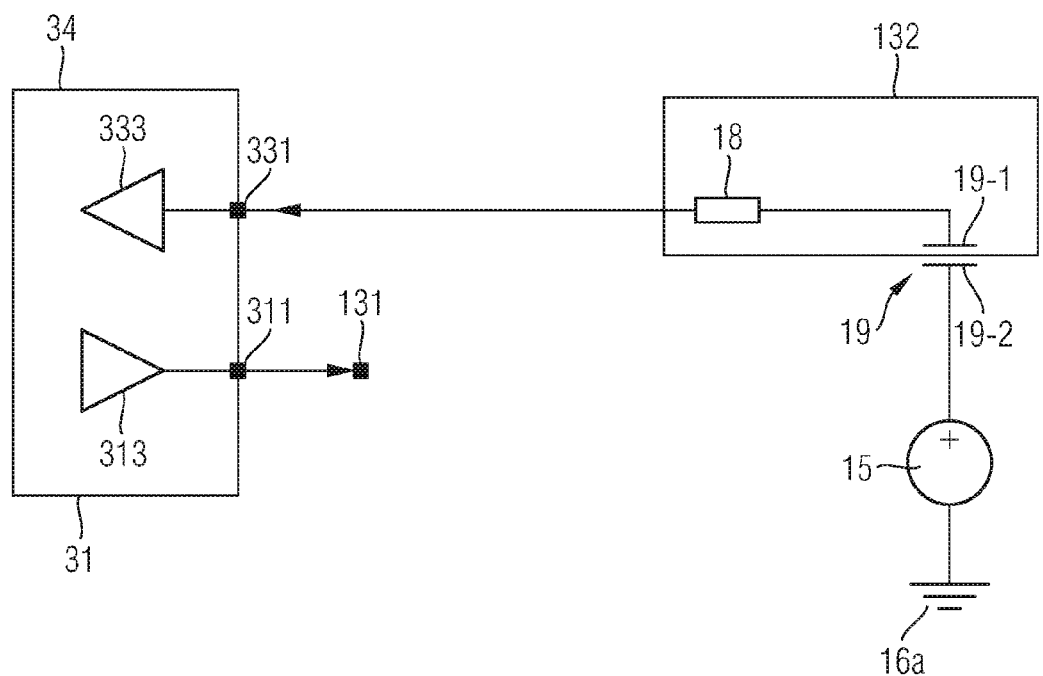
FIG. 6 schematically illustrates a section of a diagram of some aspects of a circuit arrangement in accordance with one or more embodiments.
Figure 7A:
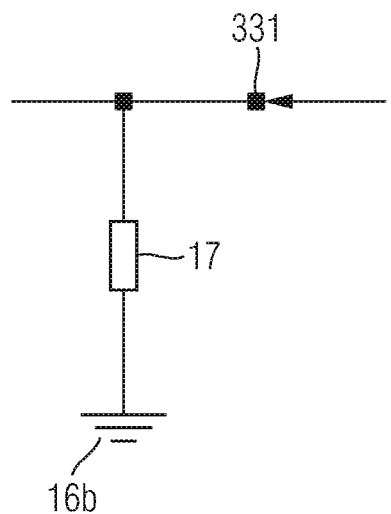
FIG. 7A-B each schematically illustrate a section of a diagram of some aspects of a circuit arrangement in accordance with one or more embodiments.
Figure 7B:
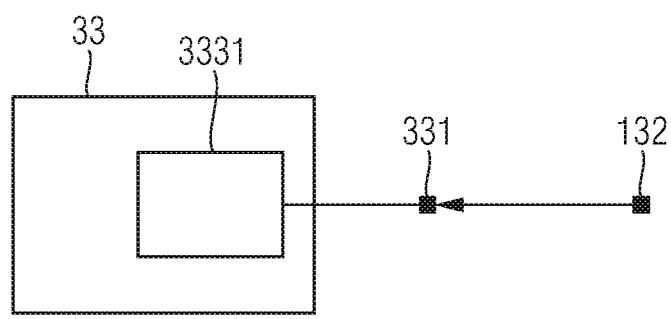

Further optional aspects of an embodiment of the circuit arrangement 3 shall now be explained with respect to FIG. 6 and FIG. 7A-B.

FIG. 6 schematically illustrates processing means 333 of the evaluation unit 33 that are electrically connected to the sensor electrode 132 via the sensor signal input 331. Further, the control signal generator 313 of the driver 31 is electrically connected to the control electrode 132 by means of the control signal output 311. As illustrated in FIG. 6, each of the processing means 333 and the control signal generator 313 may be integrated into a single housing 34. Further, in FIGS. 5 and 6, the driver 31 and the evaluation unit 33 are illustrated as being positioned external of the semiconductor device 1. However, it shall be understood that the semiconductor device 1 may monolithically integrate the semiconductor body 10 and at least one of the driver 31 and the evaluation unit 33 in a single semiconductor chip, in accordance with one or more embodiments.

The sensor electrode 132 of the semiconductor device 1 is schematically illustrated as a resistor 18 and one electrode 19-1 of a capacitor 19. As it has been explained with respect to the embodiments schematically illustrated in FIGS. 1 to 4 and FIG. 9, the sensor electrode 132 may form a capacitor with at least a section of the semiconductor body 10 that is traversed by the load current path between the first load terminal 11 and the second load terminal 12. Said section of the semiconductor body 10, e.g., a section of at least one of the semiconductor drift region 101 and the semiconductor body region 103, may form a second electrode 19-2 of the capacitor 19. As has further been explained above, said electrodes 19-1 and 19-2 may be coupled to each other by a section of an insulation, e.g., by a section of the insulation structure 133. In other words, said section may be configured to couple the first electrode 19-1—formed by the sensor electrode 132—to the second electrode 19-2 that is formed by said section of the semiconductor body 10 that is tra-versed by the load current path. Said components, i.e., the first electrode 19-1 formed by the sensor electrode 132, a section of the insulation, and said section of the semiconductor body 10 may form the capacitor 19, as schematically illustrated in FIG. 6. Thus, a voltage difference between the first electrode 19-1 and the second electrode 19-2 does not include any significant further voltage drop across the semiconductor drift region 101, in accordance with one or more embodiments.

Further, the section of the load current path traversing said section of the semiconductor body 10 that is in proximity to the sensor electrode 132 may be regarded as a voltage source 15, as it may induce an amount of electric charge within the sensor electrode 132. In FIG. 6, said section of the load current path is hence illustrated as a voltage source 15 that is configured to generate a voltage with respect to a first electric reference potential 16a, which may be, e.g., the electrical potential of either the first load terminal 11 or the second load terminal 12. Thus, metaphorically speaking, in dependence of the voltage generated by the voltage source 15, i.e., in dependence of the density of the charge carriers of the load current path, the amount of electric charge being present on the first electrode 19-1, i.e., the electrical potential of the first electrode 19-1 may vary. This electrical potential of the first electrode 19-1 may be conveyed as the sensor signal to the sensor signal input 331 which may be, as it has been stated above, set into a high impedance state. The resistance 18 of the sensor electrode 132 can be represented, e.g., by the limited electrical conductivity of the electrode material of the sensor electrode 132 and its connection to the sensor signal input 331 of the evaluation unit 33 and thus can be comparatively low, e.g., smaller than 10Ω.

As has been explained above, the processing means 333 of the evaluation unit 33 may be present in the form of entirely passive components, a schematic example of which is illustrated in FIG. 7A. There, the evaluation unit 33 comprises a sensor resistor 17 coupled to a second electric reference potential 16b, which may be the electrical potential of, e.g., one of the first load terminal 11 and the second load terminal 12. The first electrical reference potential 16a may be identical to the second electrical reference potential 16b. A voltage drop across the sensor resistor 17 may form the result signal, in accordance with one or more embodiments.

In accordance with a further embodiment, an example of which is schematically illustrated in FIG. 7B, the evaluation unit 33 may comprise a filter device 3331 configured to filter the sensor signal received via the sensor signal input 331. For example, the filter device 3331 is connected upstream to the processing means 333 (cf. FIG. 6, not illustrated in FIG. 7B) so as to provide a filtered result signal to the processing means 333. In another embodiment, the filter device 3331 forms a park of the processing means 333 or, respectively, entirely realizes the processing means 333

The filter device 3331 may exhibit a filter characteristic. Such filter characteristic can be defined by a configuration of passive components and/or digital components. For example, the filter characteristic is defined by at least one of a filter time constant, a bandwidth and a gain.

The filter device 3331 of the evaluation unit 33 may comprise, e.g., one or more resistors, one or more capacitors and/or one or more inductors so as to provide for a definite filter characteristic. In an embodiment, the semiconductor device 1 monolithically integrates at least one component of said filter device 3331, e.g., within the semiconductor body 10. Alternatively, at least some of the components of the filter device 3331 may be realized by external units, such as separate resistors, capacitors and/or inductors arranged external of the semiconductor device 1.

In a further embodiment, the evaluation unit 33 may comprise an Analog-to-Digital-Converter (ADC) configured to convert the sensor signal into a digital sensor signal. In this embodiment, the evaluation unit 33 may comprise digital signal processing means configured to digitally process the digital sensor signal, wherein such processing may include digital filtering within the filter device 3331.

For example, the filter device 3331 may comprise a bandpass filter, a lowpass filter and/or may comprise, e.g., an integrator. Said exemplary lowpass filter may exhibit a time constant of, e.g., some 100 ns or some µs. The integrator may be realized, e.g., by analog components and/or digitally.

In an embodiment, the filter device 3331 may be a controllable filter device 3331 that may be controlled with respect to its filter characteristic. For example, the evaluation unit 33 may be configured to control the filter characteristic of the filter device 3331, e.g., at least one of a filter time constant, a bandwidth and a gain of the filter device 3331.

For example, the evaluation unit 33 is configured to control the filter characteristic of the filter device 3331 in dependence of the operational state of the semiconductor device 1, which can comprise, e.g., the blocking state and the conducting state.

For example, the filter characteristic is controlled by the evaluation unit 33 such that the filter device 3331 blocks the sensor signal for a predetermined blanking time period. In an embodiment, the beginning of the blanking time period is triggered with the transition from a blocking state to the conducting state. For example, such triggering can be caused by a corresponding course of the control signal. To this end, the evaluation unit 33 may be configured to also receive the control signal provided by the driver 33. Further, the blanking time period can be within the range of, e.g., 100 ns to, e.g., 2 µs. Thus, during the blanking time period, the sensor signal is "ignored", e.g., during the blanking time period, the result signal does not change. This may allow for preventing false measurements. Further optional aspects of controlling the filter device 3331 are explained below.

In an embodiment, the filter characteristic, e.g., a filter time constant, a gain and/or a bandwidth of the filter device 3331 can be changed according to the signal present at the control signal output 311. For example, just after a transition of the control signal, the filter device 3331 can be put into a mode where it does not react quickly on small changes of the sensor signal that is input to the filter device 3331. The filter characteristic can additionally or alternatively also be changed according to an actual filter device output value, e.g., if the filtered sensor signal is below or above a certain threshold for a certain time. Additionally, the filter characteristic can additionally or alternatively also be modified according to another control signal related to one or more other power switches, e.g., in order to increase robustness against switching noise.

Figure 8:
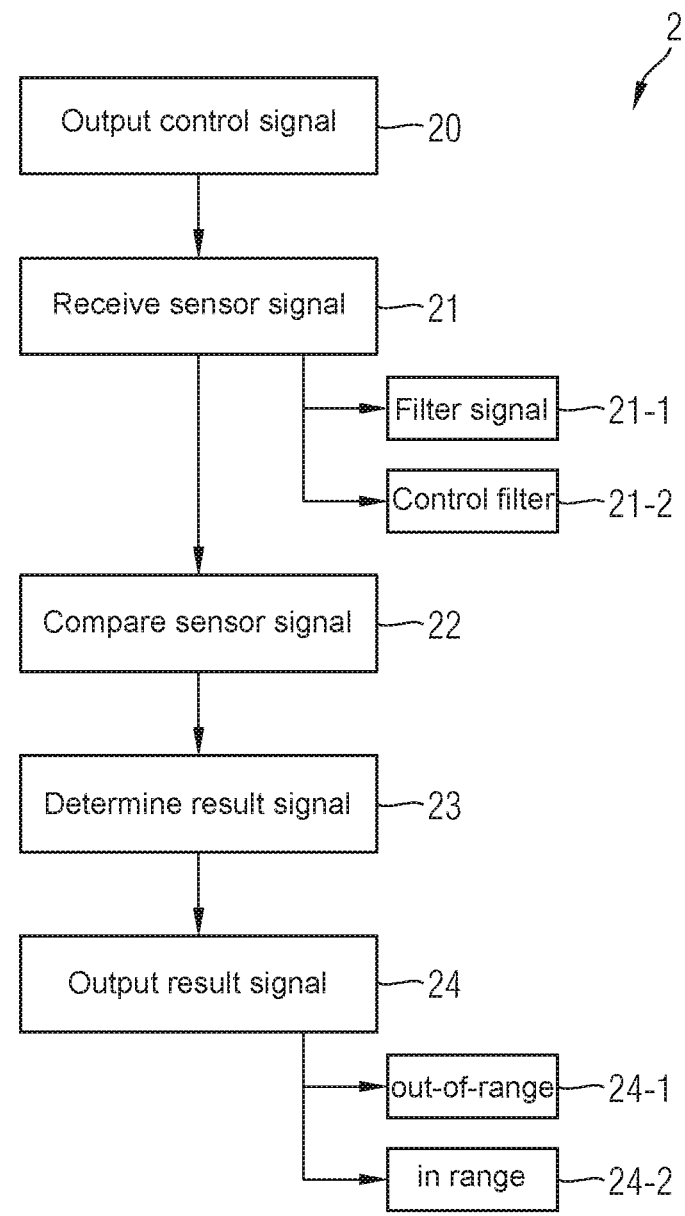
FIG. 8 schematically illustrates a section of a flow diagram of a method of controlling a semiconductor device in accordance with one or more embodiments.

FIG. 8 schematically illustrates a flow diagram of a method 2 of controlling a semiconductor device in accordance with one or more embodiments.

For example, the method 2 may constitute a method of controlling one of the embodiments of the semiconductor device 1 illustrated in FIGS. 1 to 4 and 9. Further, the method 2 may constitute a method of operating an embodiment of the circuit arrangement 3 illustrated in FIG. 5. Thus, aspects of the embodiments described above with respect to FIGS. 1 to 7B may analogously apply to the method 2.

Accordingly, the semiconductor device to be controlled may comprise a semiconductor body that is configured to operate in each of a conducting state, during which a load current is conducted in a load current path between a first load terminal and a second load terminal of the semiconductor device, and in a blocking state, during which a voltage applied between the first load terminal and the second load terminal is blocked and flow of the load current is prevented.

The method 2 may comprise outputting, in step 20, by means of a control unit, a control signal to a control electrode of the semiconductor device for setting the semiconductor device in one of the conducting state and the blocking state. For example, the control unit may comprise at least the driver 31 illustrated above. Additionally, the control unit may also comprise the system controller 35 illustrated above. Further, the control signal may be provided by applying a specific voltage between the control electrode and one of the load terminals of the semiconductor device.

The method further comprises receiving, in step 21, from an electrically floating sensor electrode that is electrically insulated from each of the semiconductor body and the control electrode and that is capacitively coupled to the load current path, a sensor signal. As it has been explained above, said sensor signal may be indicative for a magnitude of the load current actually conducted by the semiconductor body.

Subsequently, the received sensor signal may be compared, within step 22, with a first threshold value range within a first time interval by means of an evaluation unit. For example, said comparing may be carried out by the evaluation unit 33 of the circuit arrangement 3 illustrated above. The duration of the first time interval may be within the range of, e.g., a filter time constant of the filter device 3331.

In an embodiment, the first threshold value range is indicative for values smaller and equal to a nominal load current, e.g., a nominal forward load current or a nominal reverse load current, for which the semiconductor device is designed, multiplied with a certain factor. For example, the factor can be chosen in dependence of the application in which the semiconductor device is to be employed and can amount to, e.g., 1.0, 1.2, 1.5, 3.0 or 4.0, to name a few examples. Thus, an upper boundary of the first threshold value range may be indicative for 1.0, 1.2, or to 1.5 times of the nominal load current for which the semiconductor device is designed. The lower boundary may amount to zero or, depending on the application, to values indicative for 0.8, 0.9, 0.95, 1.0 or to 1.1 times of the nominal load current for which the semiconductor device is designed.

In an embodiment, at least one of upper boundary and the lower boundary is variable and controllable.

Then, in step 23, a result signal may be determined in dependence of the comparison carried out in step 22. The result signal may be output, in step 24, to the control unit afterwards.

In an example, outputting of the result signal to the control unit may comprise outputting, in step 24-1, the result signal such that it is indicative for a first operational state of the semiconductor device if the sensor signal is out of the first threshold value range during the first time interval. Further, said outputting may also comprise outputting, in step 24-2, the result signal such that it is indicative for a second operational state of the semiconductor device if the sensor signal is within the first threshold value range.

For example, if the actually conducted load current, as represented by the (optionally filtered) sensor signal, is slightly above the upper boundary, e.g., slightly above the nominal load current, this may be tolerated for a certain amount of time, e.g., some seconds, wherein said amount of time may depend on the magnitude of the difference between the actually conducted load current and the upper boundary. If, however, the load current substantially exceeds the upper boundary, e.g., if the actually conducted load current amounts to more than four times of the nominal load current, this may lead to outputting the result signal such that an immediate turn-off of the semiconductor device is initiated, e.g., by providing the control signal with said second signal course.

Thus, in an embodiment, a decision criterion for outputting the result signal may comprise one or more aspects, e.g., how long and/or how often the (optionally filtered) sensor signal exceeds the first threshold value range. This can comprise an absolute time length or an average time length, e.g., combined with a variable lower and/or upper boundary of the first threshold value range. For example, the boundary can depend on the already filtered sensor signal or on the duration in which an already output result signal is substantially constant. The wording "during the first time interval" may indicate that the (optionally filtered) sensor signal at least partially exceeds the first threshold value range within said time interval. It can fall below the first threshold value range again without the need to start the complete evaluation again (integration effect), in accordance with one or more embodiments.

For example, the first operational state is different from the second operational state. Operational states of the semiconductor device may comprise the blocking state, the conducting state, an overload state, such as a critical state or a short circuit state and so on. For example, the operational state "conducting state" is indicated by the result signal, if the load current is greater zero and smaller than the nominal value. The operational state "blocking state" may be indicated by the result signal, if the load current is substantially zero. The operational state "overload state" may be indicated by the result signal, if the load current is significantly greater than the nominal load current. The operational state "critical state" may indicated by the result signal, if the load current is insignificantly greater than the nominal load current.

In an embodiment, the method 2 further includes filtering, in step 21-1, the sensor signal by means of a filter device that exhibits a controllable filter characteristic and, in step 21-2, controlling the filter characteristic. For example, said filtering is carried out by employing a filter device 3331 as has been exemplary illustrated above. Thus, the sensor signal that has been provided by the sensor electrode of the semiconductor device may be subjected to a controlled filtering. For example, controlling of the filtering is carried out in dependence of the comparison of the sensor signal with said first threshold value range.

In an embodiment, controlling of the filter device may be carried out in dependence of the course of the control signal provided to the control electrode. In a further embodiment, controlling of the filter device may be carried out in dependence of at least one of the actual operational state of the semiconductor device indicated by the output result signal and a timing related to a transition between the first operational state and the second operational state.

Features of further embodiments are defined in the dependent claims. The features of further embodiments and the features of the embodiments described above may be combined with each other for forming additional embodiments, as long as the features are not explicitly described as being alternative to each other.

As has been explained in the above, the sensor electrode can be an electrically floating electrode. In accordance with an embodiment the sensor electrode is thus not subjected to a fixed electrically potential. However, as has been explained above, in one or more embodiments, the sensor electrode may receive a carrier signal, e.g., a carrier signal exhibiting the course of a sign wave, or may otherwise be biased so as to allow for a differential detection of the amount of charge that may be induced in the sensor electrode due to a certain charge carrier density of the load current path.

Further, the material of the one or more control electrodes presented above may be identical to the material of the sensor electrode. For example, each of a control electrodes and the sensor electrode may be made of polysilicon. For example, the electric conductivity of the sensor electrode is greater than $10^4 \, \Omega^{-1} \, m^{-1}$. In an embodiment of manufacturing a semiconductor device, forming of the sensor electrode is carried out in the same manner, e.g., simultaneously, as/to the forming of the one or more control electrodes.

As has been explained above, the sensor signal provided by the sensor electrode may be indicative for a magnitude of the load current actually conducted by the semiconductor device. For example, the determination of the load current may include a voltage measurement, e.g., by feeding the sensor signal to a sensor resistor coupled to a reference potential and by measuring the voltage across said sensor resistor. Alternatively or additionally, the magnitude of the load current may be determined by employing current measurement circuits for evaluation the sensor signal, such as a current mirror, wherein said current measurement circuit may be integrated directly within a driver.

Since the sensor electrode may be an electrically floating electrode that is not electrically connected to one of the first load terminal and the second load terminal, a comparatively thin insulation structure may be employed for electrically insulating the sensor electrode from the semiconductor body.

In the above, embodiments pertaining to power semiconductor transistors were explained. For example, these semiconductor transistors are based on silicon (Si). Accordingly, a monocrystalline semiconductor region or layer, e.g., the semiconductor regions 10, 101, 102, 103, 103-1, 103-2 of exemplary embodiments, can be a monocrystalline Si-region or Si-layer. In other embodiments, polycrystalline or amorphous silicon may be employed.

It should, however, be understood that the semiconductor regions 10, 101, 102, 103, 103-1, 103-2 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
    a first load terminal, a second load terminal and a semiconductor body coupled to the first load terminal and the second load terminal, wherein the semiconductor body is configured to conduct a load current along a load current path between the first load terminal and the second load terminal;
    a control electrode electrically insulated from the semiconductor body and configured to control a part of the load current path;
    an electrically floating sensor electrode arranged adjacent to the control electrode, wherein the sensor electrode is electrically insulated from each of the semiconductor body and the control electrode and is capacitively coupled to the load current path; and
    a trench extending into the semiconductor body along a vertical direction, the trench including the control electrode,
    wherein the sensor electrode extends at least as far along the vertical direction as the control electrode,
    wherein the trench includes each of the sensor electrode and the control electrode.

2. The semiconductor device of claim 1, further comprising an insulation structure configured to electrically insulate each of the control electrode and the sensor electrode from each of the first load terminal and the semiconductor body.

3. The semiconductor device of claim 2, wherein the insulation structure is at least partially included in the trench and forms sidewalls and a bottom of the trench.

4. The semiconductor device of claim 3, wherein the trench sidewalls comprise an upper part and a lower part, and wherein a thickness of the insulation structure at the lower part is equal to or smaller than a thickness of the insulation structure at the upper part.

5. The semiconductor device of claim 2, wherein the insulation structure isolates the control electrode from the sensor electrode.

6. The semiconductor device of claim 1, wherein a distance between the control electrode and the sensor electrode amounts to less than 3 μm.

7. The semiconductor device of claim 1, wherein the sensor electrode is configured to provide a sensor signal, the sensor signal being indicative of a magnitude of the load current conducted by the semiconductor body via the load current path.

8. The semiconductor device of claim 1, wherein the sensor electrode forms a capacitor with at least a section of the semiconductor body that is traversed by the load current path.

9. The semiconductor device of claim 8, further comprising an insulation structure configured to electrically insulate each of the control electrode and the sensor electrode from each of the first load terminal and the semiconductor body, and wherein:
    the sensor electrode forms a first electrode of the capacitor;
    the section of the semiconductor body forms a second electrode of the capacitor; and
    the insulation structure electrically isolates the first electrode and the second electrode from each other.

10. A circuit arrangement comprising a semiconductor device, a driver, a system controller, and an evaluation unit, wherein:
    the semiconductor device comprises:
        a first load terminal, a second load terminal and a semiconductor body coupled to the first load terminal and the second load terminal, wherein the semiconductor body is configured to conduct a load current along a load current path between the first load terminal and the second load terminal;
        a control electrode electrically insulated from the semiconductor body and configured to control the load current path; and
        an electrically floating sensor electrode, wherein the sensor electrode is electrically insulated from each of the semiconductor body and the control electrode and is capacitively coupled to the load current path;
    the driver comprises a control signal output electrically coupled to the control electrode;
    the evaluation unit comprises a sensor signal input electrically coupled to the sensor electrode and configured to receive a sensor signal from the sensor electrode;
    the system controller is configured to control the driver;
    the evaluation unit is configured to provide a result signal derived from the received sensor signal to at least one of the driver and the system controller.

11. The circuit arrangement of claim 10, wherein the evaluation unit is configured to set the sensor signal input in a high impedance state.

12. The circuit arrangement of claim 10, wherein the evaluation unit comprises a controllable filter device configured to filter the received sensor signal.

13. A method of controlling a semiconductor device, the semiconductor device having a semiconductor body being configured to operate in each of a conducting state, during which a load current is conducted in a load current path between a first load terminal and a second load terminal of the semiconductor device, and in a blocking state, during which a voltage applied between the first load terminal and the second load terminal is blocked and flow of the load current is prevented, the method comprising:

outputting, by means of a control unit, a control signal to a control electrode of the semiconductor device for setting the semiconductor device in one of the conducting state and the blocking state;

receiving, from an electrically floating sensor electrode that is electrically insulated from each of the semiconductor body and the control electrode and that is capacitively coupled to the load current path, a sensor signal, the sensor signal being indicative for a magnitude of the load current conducted by the semiconductor body;

comparing, by means of an evaluation unit the received sensor signal with a first threshold value range within a first time interval;

determining a result signal in dependence of the comparison; and outputting result signal to the control unit, wherein the outputting comprises:

outputting the result signal such that it is indicative for a first operational state of the semiconductor device if the sensor signal is out of the first threshold value range during the first time interval; and outputting the result signal such that it is indicative for a second operational state of the semiconductor device if the sensor signal is within the first threshold value range.

14. The method of claim 13, further comprising:
filtering the sensor signal by means of a filter device that has a controllable filter characteristic; and
controlling the filter characteristic.

15. The method of claim 14, wherein controlling the filter characteristic is carried out in dependence of at least one of the actual operational state of the semiconductor device indicated by the output result signal and a timing related to a transition between the first operational state and the second operational state.

16. A circuit arrangement comprising a semiconductor device, a driver and an evaluation unit, wherein:

the semiconductor device comprises:
a first load terminal, a second load terminal and a semiconductor body coupled to the first load terminal and the second load terminal, wherein the semiconductor body is configured to conduct a load current along a load current path between the first load terminal and the second load terminal;
a control electrode electrically insulated from the semiconductor body and configured to control the load current path; and
an electrically floating sensor electrode, wherein the sensor electrode is electrically insulated from each of the semiconductor body and the control electrode and is capacitively coupled to the load current path;

the driver comprises a control signal output electrically coupled to the control electrode;

the evaluation unit comprises a sensor signal input electrically coupled to the sensor electrode and configured to receive a sensor signal from the sensor electrode; and at least one of:
the evaluation unit is configured to set the sensor signal input in a high impedance state; and
the evaluation unit comprises a controllable filter device configured to filter the received sensor signal.

* * * * *